US010361329B2

(12) United States Patent
Bordain et al.

(10) Patent No.: US 10,361,329 B2
(45) Date of Patent: Jul. 23, 2019

(54) PHOTOVOLTAIC DESALINATION SYSTEM

(71) Applicant: The Regents of the University of California, Oakland, CA (US)

(72) Inventors: Yemaya C. Bordain, Phoenix, AZ (US); Manas Ranjan Gartia, Baton Rouge, LA (US); Gang Logan Liu, Urbana, IL (US); Lisa Plucinski, Urbana, IL (US); Luman Qu, Davis, CA (US); Harry B. Radousky, Livermore, CA (US); Brent Trenhaile, Champaign, IL (US); Gergely T. Zimanyi, Davis, CA (US)

(73) Assignee: The Regents of the University of California, Oakland, CA (US)

( * ) Notice: Subject to any disclaimer, the term of this patent is extended or adjusted under 35 U.S.C. 154(b) by 674 days.

(21) Appl. No.: 15/136,475

(22) Filed: Apr. 22, 2016

(65) Prior Publication Data

US 2016/0310899 A1    Oct. 27, 2016

Related U.S. Application Data

(60) Provisional application No. 62/151,586, filed on Apr. 23, 2015.

(51) Int. Cl.
*H01L 31/042*    (2014.01)
*H01L 31/068*    (2012.01)
(Continued)

(52) U.S. Cl.
CPC .......... *H01L 31/068* (2013.01); *C02F 1/4604* (2013.01); *H01L 31/0203* (2013.01);
(Continued)

(58) Field of Classification Search
CPC .... B01D 61/364; C02F 1/447; C02F 2103/08; C02F 1/4604; C02F 1/4691;
(Continued)

(56) References Cited

U.S. PATENT DOCUMENTS 5,266,125 A * 11/1993 Rand .................. H01L 31/0236
                                                136/244
8,039,740 B2 * 10/2011 Walukiewicz ...... H01L 31/0725
                                                136/261
(Continued)

OTHER PUBLICATIONS

Al-Karaghouli et al., "Technical and economic assessment of photovoltaic-driven desalination systems." Renewable Energy 35 (2010): 323-328 http://www.wrri.nmsu.edu/conf/conf11/photovoltaic_desal_systems.pdf.

*Primary Examiner* — Walter D. Griffin
*Assistant Examiner* — Cameron J Allen
(74) *Attorney, Agent, or Firm* — Park, Vaughan, Fleming & Dowler LLP

(57) ABSTRACT

A photovoltaic desalination system can comprise a solar cell, configured to receive solar radiation, including an n-doped semiconductor layer, a p-doped semiconductor layer, the two semiconductor layers forming a p-n junction, and an channel array, formed in the p-n junction; an input reservoir, coupled to the solar cell, the input reservoir configured to contain a salty fluid, and to release the salty fluid to the solar cell; an output fluid management system, coupled to the solar cell, the output fluid management system configured to receive an output fluid from the solar cell; wherein the channel array is configured to receive the salty fluid from the input reservoir, and to output the output fluid to the output fluid management system.

27 Claims, 16 Drawing Sheets

(51) Int. Cl.
*H01L 31/0203* (2014.01)
*H02S 40/42* (2014.01)
*C02F 1/46* (2006.01)
*C02F 103/08* (2006.01)
*C02F 1/469* (2006.01)

(52) U.S. Cl.
CPC .......... *H01L 31/042* (2013.01); *H02S 40/425* (2014.12); *C02F 1/4691* (2013.01); *C02F 2103/08* (2013.01); *C02F 2201/46165* (2013.01); *Y02A 20/142* (2018.01); *Y02E 10/547* (2013.01)

(58) Field of Classification Search
CPC ....... C02F 2201/46165; C02F 2103/00; H01L 31/042; H01L 31/0203; H01L 31/068; Y02A 20/142; Y02E 10/547; H02S 40/425

See application file for complete search history.

(56) References Cited

U.S. PATENT DOCUMENTS

| | | | |
|---|---|---|---|
| 8,834,696 B2 * | 9/2014 | Kim | B01D 57/02 204/452 |
| 2011/0011802 A1 * | 1/2011 | Maydan | C02F 1/02 210/652 |

* cited by examiner

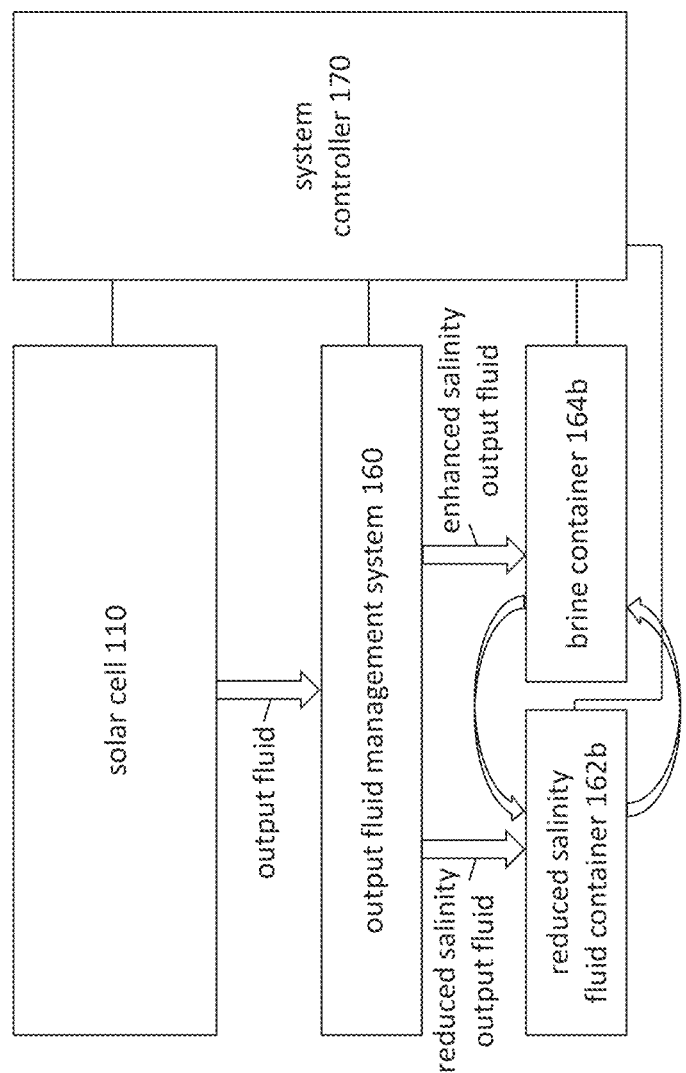

PHOTOVOLTAIC DESALINATION SYSTEM

RELATED APPLICATION

This application claims priority under 35 U.S.C. § 119 to U.S. Provisional Application No. 62/151,586, entitled "Photovoltaic Desalination System," by inventors Yemaya Bordain, Manas Gartia, Logan Liu, Lisa Plucinski, Luman Qu, Harry Radousky, Brent Trenhaile, and Gergely T. Zimanyi, filed 23 Apr. 2015, the contents of which are incorporated by reference in their entirety.

TECHNICAL FIELD

This patent document is related to desalination systems. In more detail, this patent document relates to desalination systems powered by photovoltaic structures.

BACKGROUND

Desalination can be accomplished using a number of techniques. These may be classified as thermal processes that involve phase change such as Multi Stage Flash, membrane processes that do not involve phase change such as Reverse Osmosis (RO), and hybrid processes that involve both membrane and phase change such as membrane distillation. Currently, reverse osmosis (RO) is the standard approach to desalinate seawater. About 60% of the worldwide installed desalination capacity is based on RO.

However, persisting challenges of the RO technology limit its wider acceptance. These challenges include the following. (1) The diameter of the pores of the RO membranes is less than 1 nm. Therefore, the pores are prone to clogging and fouling, requiring the regular replacement of the RO membranes, which in turn increases the operating costs and complexity of such systems. (2) In the RO process, the saltwater is forced through these very small pores of the membranes. Further, there are large osmotic pressures working against the desalination. Overcoming both sources of resistance requires the consumption of significant amount of electrical energy. (3) The required electrical energy is typically generated by burning fossil fuels, which in turn further accelerates global warming that caused the water shortage in the first place. (4) In many developing countries, the power grid is unreliable. Therefore, the operation of grid-dependent RO desalination system is unreliable in these countries. For at least the above reasons, there is a pressing need to develop alternatives to the RO desalination technology. Some of these solutions need not replace RO in every possible application space. Rather, they can offer a competitive alternative to RO in some specific application niches, and thus could coexist with RO.

SUMMARY

In some embodiments, a photovoltaic desalination system can comprise a solar cell, configured to receive solar radiation, including an n-doped semiconductor layer, a p-doped semiconductor layer, the two semiconductor layers forming a p-n junction, and an channel array, formed in the p-n junction; an input reservoir, coupled to the solar cell, the input reservoir configured to contain a salty fluid, and to release the salty fluid to the solar cell; an output fluid management system, coupled to the solar cell, the output fluid management system configured to receive an output fluid from the solar cell; wherein the channel array is configured to receive the salty fluid from the input reservoir, and to output the output fluid to the output fluid management system.

BRIEF DESCRIPTION OF THE DRAWINGS

FIGS. 5A-E illustrate embodiments of an output fluid management system.

DETAILED DESCRIPTION

Figure 1A:
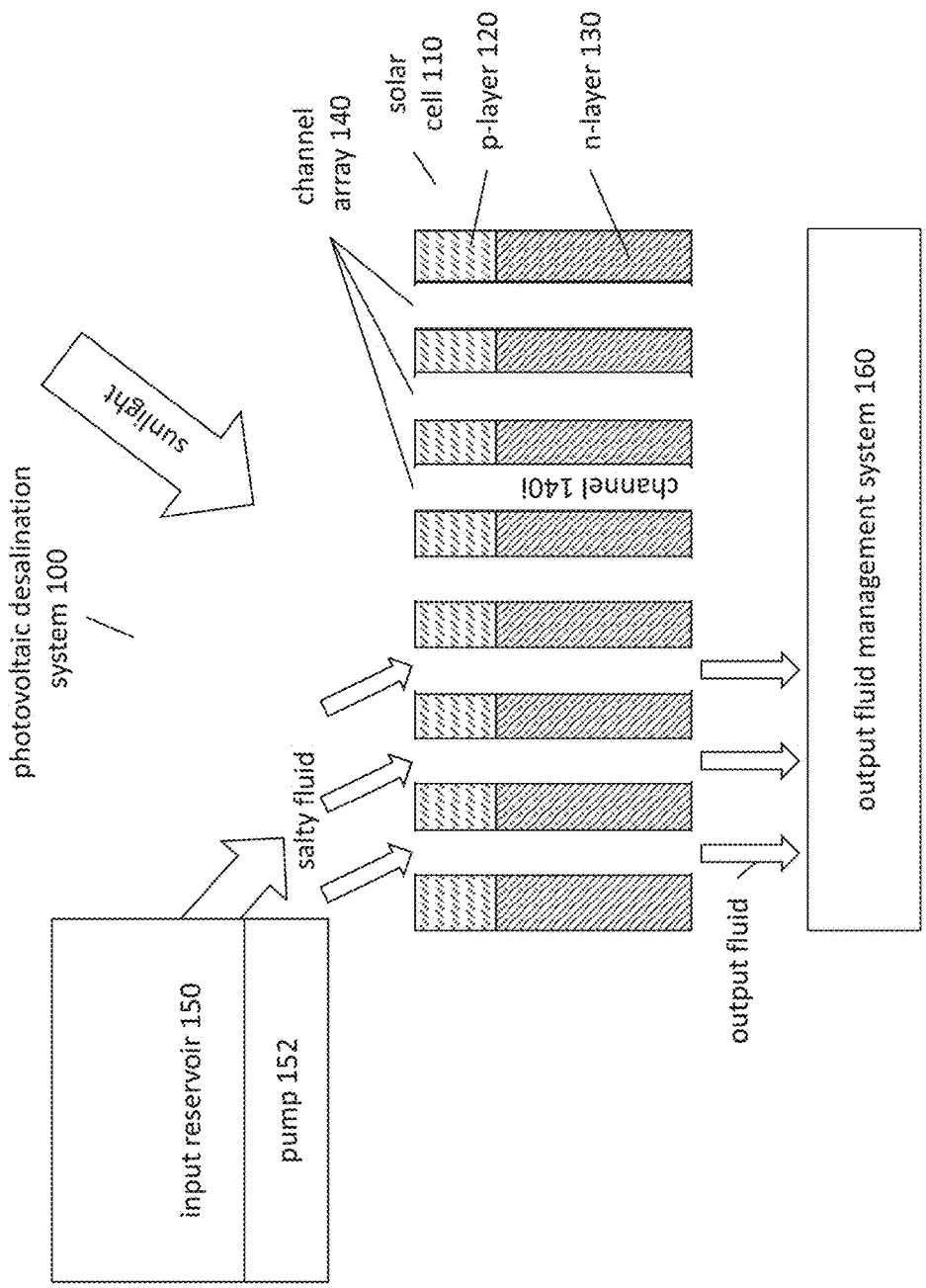
FIGS. 1A-B illustrate embodiments of a photovoltaic desalination system.
Figure 1B:
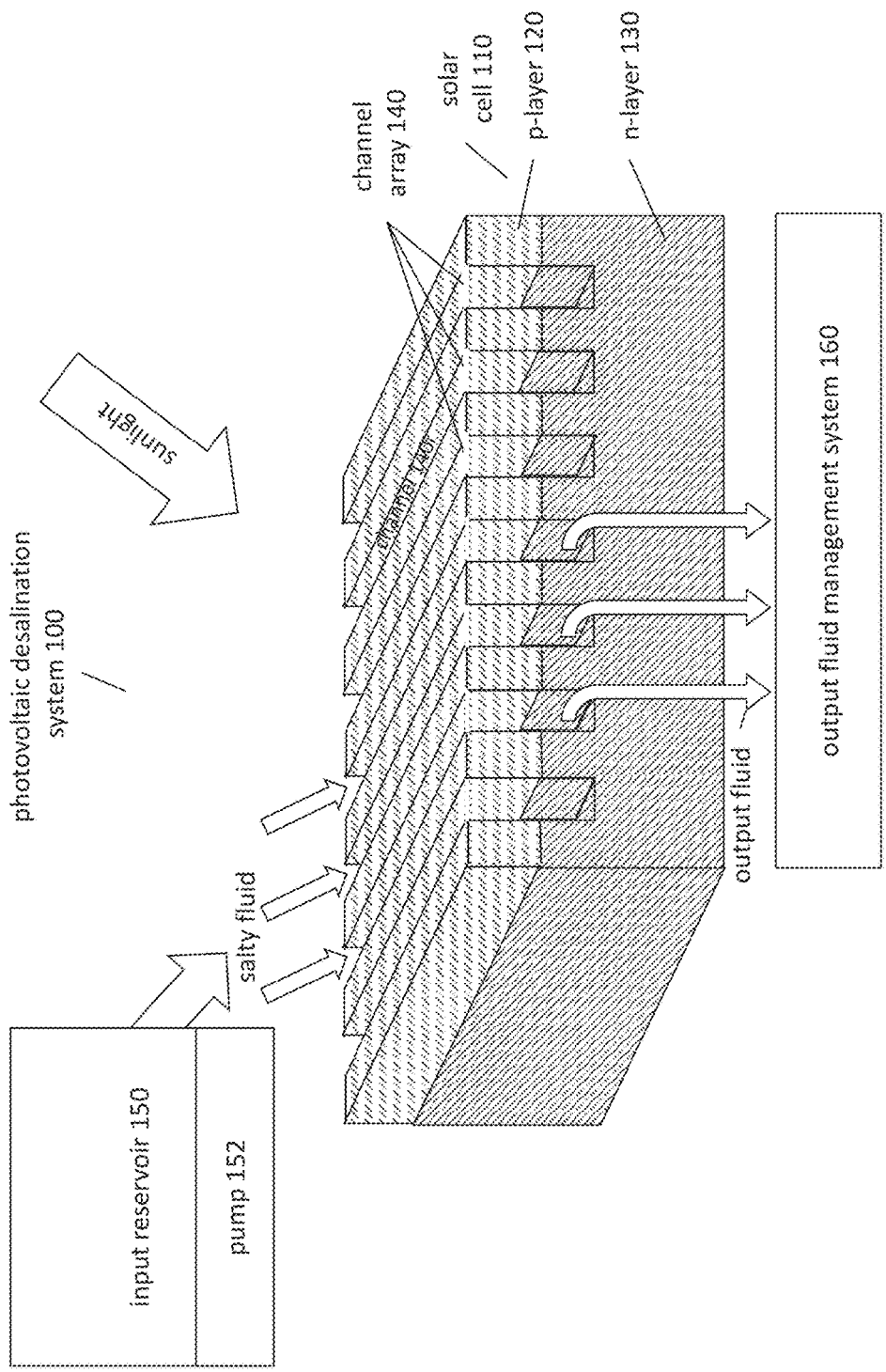

FIGS. 1A-B illustrate embodiments of a photovoltaic desalination (PVD) system where the active desalination unit is a photovoltaic system with a large number of channels, or pores, formed in a solar cell. Some aspects of such PVD systems include (1) the primary source of energy and power is solar illumination, thus reducing the energy consumption markedly relative to the typical Reverse Osmosis (RO) desalination systems. (2) The channels are formed in the solar cell of the PVD system, which is not replaced regularly. Instead, it is used over an extended time period. These PVD systems are operated in a cyclic manner. In each cycle, after a desalination phase, the channels are flushed, thus removing potential clogging agents. This design allows the PVD systems to be operated without a membrane that would require regular replacement, like in the RO systems. This aspect substantially reduces the operating costs. (3) The primary mechanism of ion removal from the saltwater is capacitive in these PVD systems. It is based on the differences of electric potentials, not chemical potentials. Therefore, substantially larger pores or channels can be used in the PVD systems than in the RO systems, thus reducing the problems associated with clogging of the pores, characteristic of the membrane-based RO systems. (4) The larger channel size in the PVD systems also reduces the flow resistance. Therefore, substantially smaller pressures and pumps are sufficient to operate the PVD systems than needed by the RO systems, further reducing their energy consumption.

In detail, FIGS. 1A-B illustrate a photovoltaic desalination system 100, comprising: a solar cell 110 to receive solar radiation or sunlight, the solar cell 110 including a p-doped semiconductor layer (or p-layer) 120, an n-doped semiconductor layer (or n-layer) 130, the two semiconductor layers forming a p-n junction; a channel array 140, formed in the p-n junction of the solar cell 110; an input reservoir 150, coupled to the solar cell 110, the input reservoir 150 configured to contain a salty fluid and to release the salty fluid to the solar cell 110; and an output fluid management system 160, coupled to the solar cell 110, the output fluid management system 160 configured to receive an output fluid from the solar cell 110. In this PVD system 100 the channel array 140 is configured to receive the salty fluid from the input reservoir 150, and to output the output fluid to the output fluid management system 160.

For clarity of the figures, the p-layer and the n-layer are shown with comparable thickness. In many commercially available solar cells these layers have very different thicknesses. For example, a thickness of the p-layer 120 is often on the scale of 1 microns or less, whereas the n-layer 130 often has a thickness of 50-200 microns. Typical doping levels of these layers 120 and 130 can vary in the $10^{17}$-$10^{21}$ cm$^{-3}$ range. In some solar cells, the doping levels vary in the $10^{18}$-$10^{20}$ cm$^{-3}$ range. Also, PVD systems with opposite doping layer structures, with the n-layer 130 on the input face, and with the p-layer 120 on the output side, can be comparably effective as the embodiments in FIGS. 1A-B.

In some embodiments, the photovoltaic desalination system 100 can include a pump 152 to pump the salty fluid from the input reservoir 150 to the channel array 140. The coupling of the pump 152 to the solar cell 110 can be a closed system to apply and to maintain a pumping pressure on the salty fluid.

FIG. 1A illustrates that in some PVD systems 100 the channels 140i of the channel array 140 can be formed perpendicular to the two semiconductor layers 120 and 130, through the p-n junction.

In some of these PVD systems 100, the salty fluid can flow to the channels 140i of the channel array 140 and get outputted as the output fluid to the output fluid management system 160 driven by gravity alone. Such embodiments may not need to employ a pump 152 at all, further reducing the energy needs of the operation of the PVD system 100.

FIG. 1B illustrates that in other embodiments of the PVD system 100 the channels of the channel array 140 can be formed approximately parallel to the two semiconductor layers 120 and 130, in the p-n junction. In such embodiments, the salty fluid can flow longer along, and in close proximity of the p-n junction, enhancing the desalination efficiency. Also, channels that are parallel to the semiconductor layers 120/130 can be formed by well-established lithographic methods.

Figure 2A:
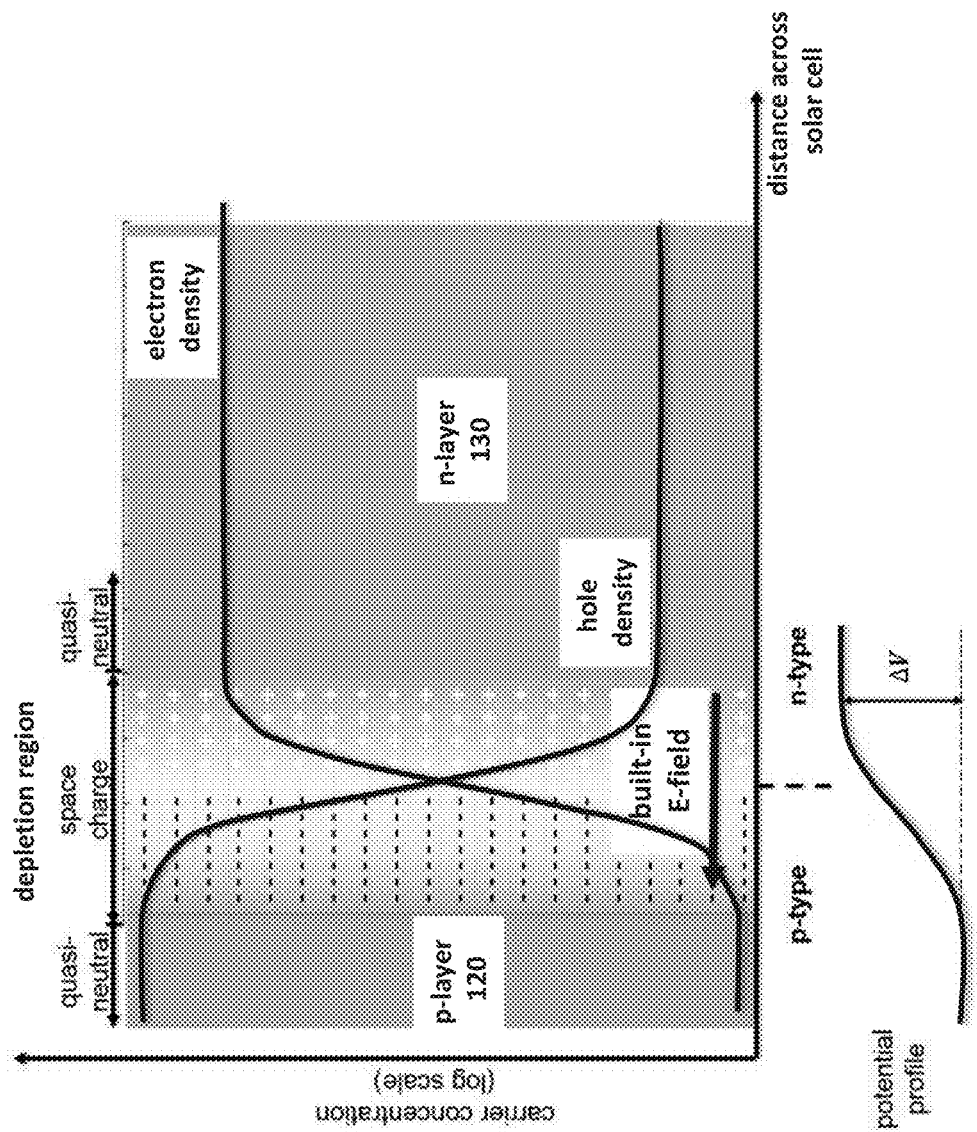
FIGS. 2A-C illustrate principles of the photovoltaic desalination system.
Figure 2B:
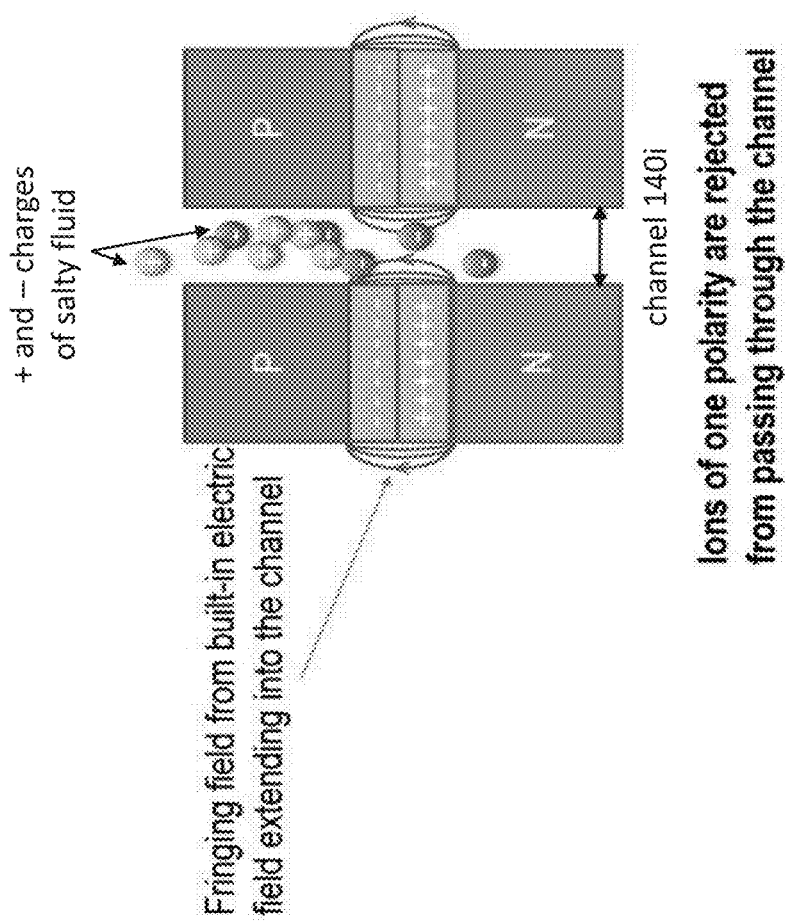
Figure 2C:
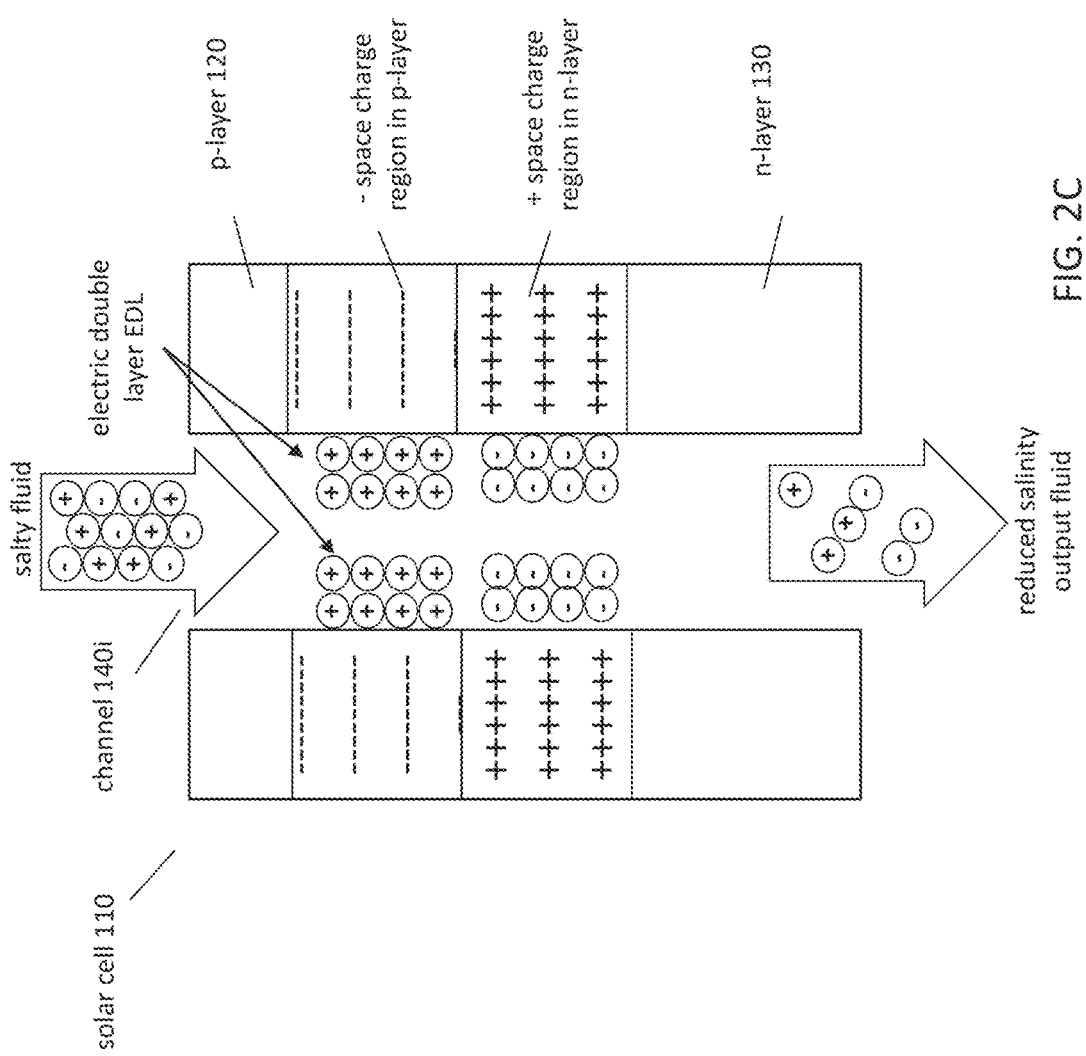

FIGS. 2A-C illustrate principles of operation of the PVD system 100. FIG. 2A illustrates that in both classes of the PVD systems 100, the different types of the doping in the two layers 120 and 130 induce the formation of a space charge in the p-n junction, the so-called depletion region. In detail, a net negatively charged region forms in the p-layer 120, and a net positively charged region forms in the n-layer 130 as a consequence of the mobile carriers diffusing across the p-n junction from both sides, driven by charge density gradients, where they annihilate the oppositely charged mobile carriers. This process tilts the charge balance between mobile carriers and immobile dopant ions on both sides of the p-n junction. As a consequence, the immobile negatively charged acceptors in the p-region and the immobile positively charged donors in the n-region form the mentioned space charge. The width w of the depletion region can vary, but in numerous solar cells this width w is less than one micron, often 0.3-0.5 micron. This space charge creates an internal, or "built-in" electric field across the p-n junction, as shown. The potential difference $\Delta V$, generated by this built-in electric field, is often in the 0.5-1.5V range, more typically in the 0.6-0.8V range. A potential profile of the corresponding voltage is shown in FIG. 2A.

When the two semiconductor layers 120 and 130 and their p-n junction is exposed to solar radiation, additional mobile electron-hole pairs are photo-generated in both the p-layer 120 and n-layer 130. These pairs diffuse inside the p/n-layers 120/130 and eventually get separated by the built-in electric field to the opposing sides of the p-n junction. These photo-generated carriers boost the charge concentration of the so-called minority carriers on each side, in effect reducing the built-in field and corresponding voltage $\Delta V$.

The space charge, the corresponding built-in electric field, and their modification by the solar illumination has various effects on the charged ions of the salty fluid flowing through the individual channels 140i of the channel array 140, which include the following.

(1) FIG. 2B illustrates that the built-in field lines originate in the positive space charge region, and extend into the channel 140i, forming a fringing field. When the + and − charged ions enter the channel 140i, one of these ions will be rejected by these fringing fields, preventing the passage through the channel 140i. In some embodiments, a second type of flinging field is formed around the entrance of the channel 140i that rejects the other type of ions. Embodiments where the dominant desalination process proceeds via such ion rejection will be referred to as "ion-rejection PVD systems 100".

The efficiency of this ion-rejection mechanism is reduced by the screening of the fringing fields by the ions of the salty fluid. These ions form an Electric Double Layer (EDL) at the wall of the channel 140i that screens the fringing field from penetrating the fluid beyond a screening length. In some PVD systems the screening (or Debye) length $\lambda$ can be in the 1-10 nm range, inversely proportional to the concentration of the ions in the salty fluid. At distances farther away from the wall of the channel 140i than the screening length $\lambda$, the magnitude of the fringing field is exponentially diminished and the efficiency of the ion rejection is substantially weaker. The theory of the formation of the Electric Double Layer is a complex problem that has been extensively studied for several decades and will not be described here in detail. The state of art is summarized e.g. in "Micro- and Nanoscale Fluid Mechanics" by B. J. Kirby, Cambridge University Press, 2010, especially in Chapter 6.

(2) FIG. 2C illustrates that the space charge of the depletion region exerts an electrostatic attraction on the ions in the fluid. The positively charged space charge region in the n-layer 130 attracts the negative ions of the salty fluid, and the negatively charged space charge region in the p-layer 120 attracts the positive ions of the salty fluid. Thus, the ions of the salty fluid are attracted to the wall of the individual channels 140i. The ions of the fluid form the electric double layer (EDL) with the charges of the semiconductor layers, as shown. The ions in the EDL largely stick to the wall and stop moving with the fluid. Therefore, as the salty fluid enters the channel 140i, the concentration of the ions of the inputted salty fluid decreases as the salty fluid flows along the channel 140i, crossing the depletion region of the p-n junction. This ion-capture via the formation of the EDL reduces the ion concentration in the output fluid. Embodiments where the dominant desalination process is the capturing of the ions via forming an EDL will be referred to as "ion-capture PVD systems 100". The ion-rejection and the ion-capture mechanisms are of course related to each other to some degree, as both are driven by the buildup of space charge in the depletion region.

A secondary ion-capture mechanism in these PVD systems 100 can take place even away from the depletion region. In fact, the ions of the salty fluid can attract the mobile charges of the p-layer 120 and the n-layer 130 to the channel wall along the entire length of the channel 140i, in effect polarizing these semiconductor layers 120/130. While the efficiency of the ion-capture via this polarization can be lower than the ion-capture efficiency of the charges of the depletion region, this polarization takes place along the entire length of the channel 140i. This length can be 50-100 microns long, whereas the depletion region can be less than 1 micron long. Therefore, in some embodiments, the integrated efficiency of this secondary polarizing process can be comparable to the efficiency of the ion-rejection by the depletion region. PVD systems that are developed based on this secondary ion-capture mechanism alone are further discussed in relation to FIG. 7.

Various embodiments of the PVD system 100 can support a high density of channels 140i within their channel array 140, thereby providing a large total surface area of the walls of these channels to enhance the desalination efficiency. This high channel density can be characterized in different manners. In some embodiments of the PVD system 100, a separation of the channels 140i of the array 140 can be less than 1,000 nm. In some embodiments of the PVD systems 100, the channel separation can be less than 200 nm. In some PVD systems 100, a radius of the channels 140i can be less than 100 nm. In other embodiments, a radius of the channels 140i can be less than 20 nm. It is noted here that these diameters can still be substantially larger than the 1 nm diameters of the RO membranes.

In some PVD systems 100, an areal density of channels can be greater than $10^6$ channels/m², i.e. more than a million channels can be formed in a 1 m² frontal/face area of the solar cell 110. In some embodiments, this areal density of channels can be greater than $10^7$ channels/m².

Yet another way to characterize the density of channels is through noting that in some embodiments of the PVD system 100, an area fraction of the channels can be in the range of 10-50%. In other words, in some embodiments, 10-50% of the total or active frontal surface area, or face, of the solar cell 110 can belong to one of the channels 140i of the channel array 140, while the rest of the area to the solar cell 110 itself. In some other embodiments, this area fraction of the channels can be in the range of 50-90%.

Figure 3B:
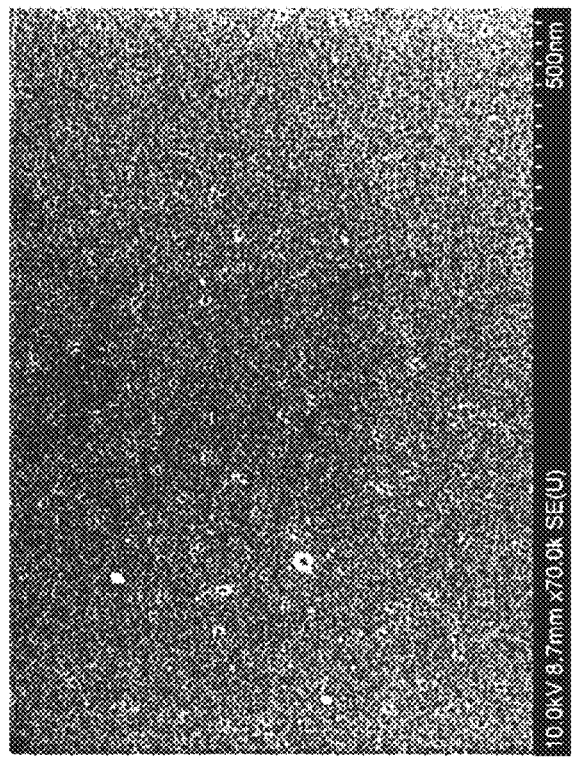
FIGS. 3A-C illustrate scanning electron microscope images of a photovoltaic desalination system.
Figure 3A:
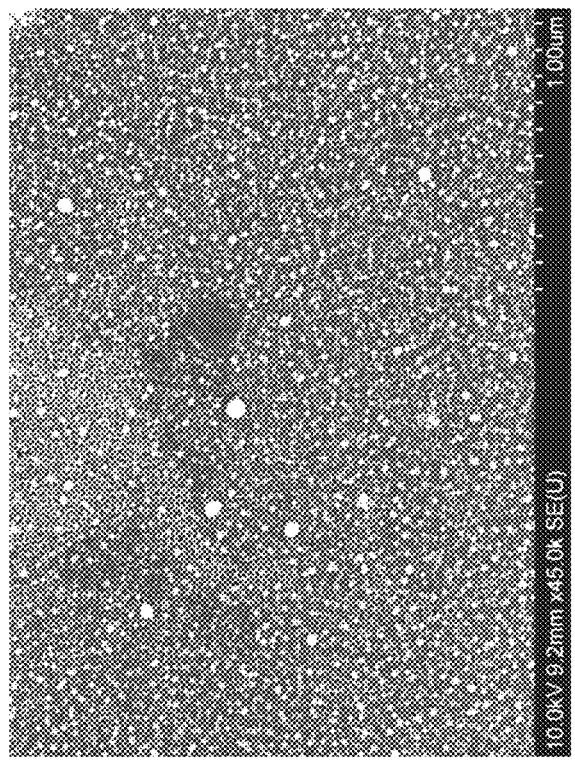
Figure 3C:
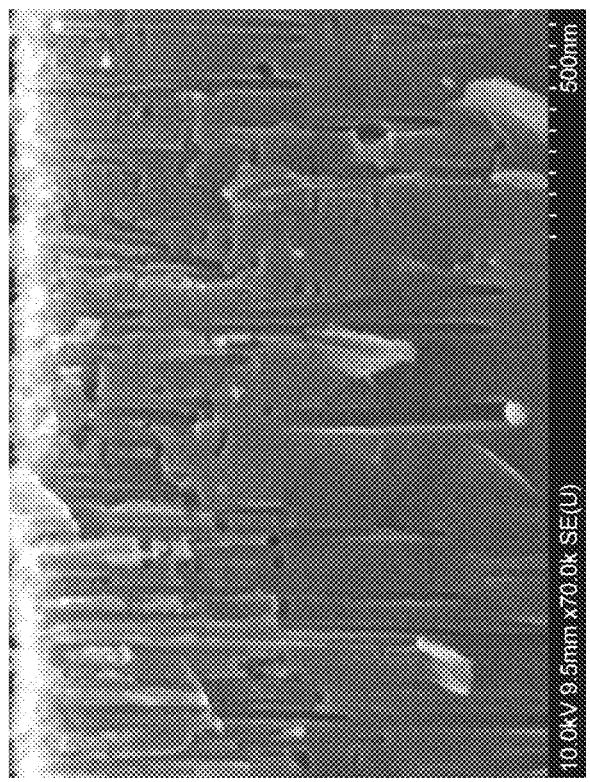

FIGS. 3A-C are scanning electron microscope (SEM) images of a PVD system 100 formed in a commercially available solar cell according to the principles illustrated in FIG. 1A. The shown embodiments were developed starting with a commercially available 4" silicon solar cell wafer, with a combined thickness of the p-layer 120 and n-layer 130 in the 50-100 microns range. The aluminum contacts were removed using an aluminum etchant. The wafer then was diced into 3 cm×3 cm chips. Next, a hydrofluoric/nitric/acetic (HNA) isotropic silicon wet etchant was used to form thin silicon layers from the back of the silicon chips. In contrast to KOH anisotropic etching methods, HNA does not require the use of photolithography to pattern etching windows.

FIG. 3A illustrates that next silver nanoparticles were formed on the silicon layer by the reduction of a 1 mM silver nitrate solution with a 0.5% hydrofluoric (HF) solution. The diameter of the Ag nanoparticles was in the range of 20-50 nm. Various techniques can be applied to control and narrow the size distribution of these nanoparticles.

FIG. 3B illustrates that these metal nanoparticles act as catalysts and etch away the silicon directly under them, forming the channels 140i. In effect, the nanoparticles sink into the silicon, forming the channels as they go. FIG. 3B illustrates the same silicon layer as FIG. 3A, only after the Ag nanoparticles sank or etched into the Si layer. The etching was done also from the back of the silicon chip or layer in order to minimize damage to the p-n junction. Some of the embodiments were fabricated with an etch rate of approximately 1 micron/min. To make sure that most of the channels etch through the entire Si layer, the etching can be performed for a few hours.

FIG. 3C illustrates a SEM image of a cross section of the etched Si layer. Many channels are etched not exactly perpendicular to the surface and thus appear to end in the image, whereas in the embodiments they continue either in front or behind the plane of the cross section. Once the channels have been etched, the current voltage characteristics of the solar cell 110 were measured to confirm that the system still functioned properly as a solar cell, in spite of the formation of the large number of channels. Samples were retained where the open circuit voltage Voc did not decrease by more than 10% of its pre-etch value.

Referring to the previously described PVD embodiments, ion-rejection PVD systems can operate continuously, as the ions get rejected on the input/entry face of the solar cell 110. Such embodiments can include a lateral fluid management system on the front/input face of the solar cell 110, in a way that the fluid is moved laterally over the openings of the channel array 140. Since the water molecules of the salty fluid are allowed to pass through the channels, while the salt ions get rejected by the fringe fields, the salt ion concentration of the laterally moving salty fluid continuously increases. A component of the output fluid in these embodiments is the enhanced-salt-concentration fluid, or brine, that can be collected after it traversed the frontal surface of the solar cell 110. Thus, the output fluid management system 160 has two components in such ion-rejection PVD systems 100: one component on the front of the solar cell 110, collecting and removing the laterally moving high salt-concentration brine, and one on the back side that collects the low salt concentration output fluid as they leave the channel array 140. Since in these ion-rejection PVD systems 100 both components of the output fluid can be removed continuously, these embodiments can be continuously operated.

On the other hand, in ion-capture PVD systems 100, the ions are captured inside the channels 140i, adsorbed to the channel walls. Some embodiments remove these captured ions by reducing the charge densities in the solar cell in a cyclic manner. As described in relation to FIG. 2A, the charge densities in the solar cell can be reduced e.g. by applying solar illumination to the solar cell 110, as outlined in detail below. Once the charge densities are reduced, the captured, or adsorbed, ions are released from the channel walls and flushed out from the channels 140i. Such ion-capture PVD systems 100 output a low salt concentration, or desalinated output fluid in a first, desalinating phase, followed by the output of a high salt concentration brine in a second, flushing phase. Since both these output fluids are outputted at the back-end of the solar cell 110, the output fluid management system 160 has to switch back and forth between two types of output operations. Therefore, some embodiments of these ion-capture PVD systems 100 are operated in a non-continuous, cyclic operation, as described next.

Figure 4:
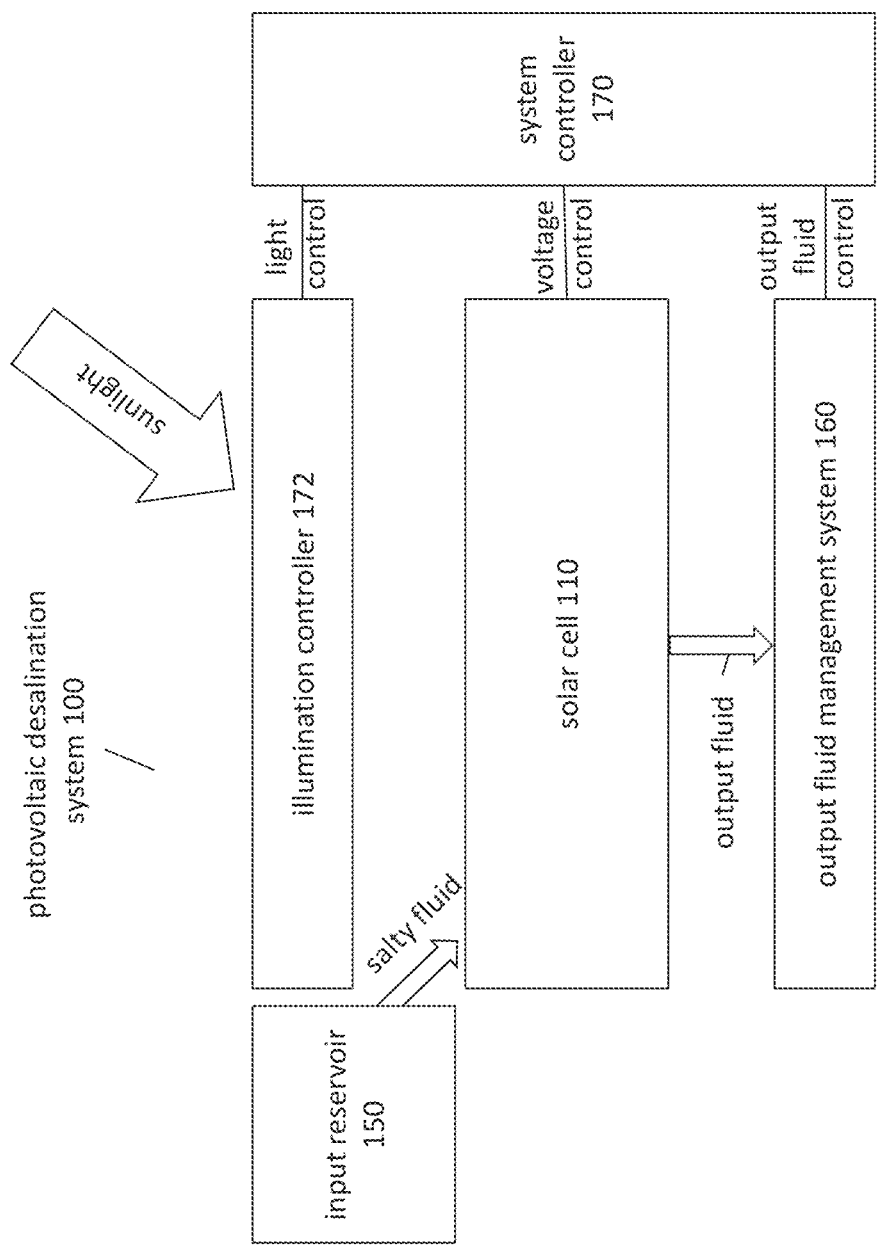
FIG. 4 illustrates embodiments of a photovoltaic desalination system with a system controller, an output fluid management system and an illumination controller.

FIG. 4 illustrates embodiments of such an ion-capture PVD system 100 that can include a system controller 170, configured to operate the photovoltaic desalination system 100 in a cyclic manner, including a desalination phase and a flushing phase. Embodiments of such PVD systems 100 can be configured to output the output fluid having a reduced salinity in the desalination phase, and having an enhanced salinity in the flushing phase. The system controller 170 can be coupled to the solar cell 110 for a potential control of a voltage. The system controller 170 can also be coupled to the output fluid management system 160 to control the cyclic output operations. Finally, the system controller 170 can be coupled to an illumination controller 172. As described above, a solar illumination of the solar cell 110 reduces the density of charges in the solar cell 110 and therefore reduces the efficiency of the desalination process. In an approximate sense, switching the solar illumination on and off de-activates and activates the desalination operation of these cyclically operated ion-capture PVD systems 100.

In some embodiments, the illumination controller 172 is configured to adjust the solar illumination of the solar cell 110. In such PVD systems 100, the system controller 170 can be configured to control the illumination controller 172 to decrease a solar illumination of the solar cell 110 in the desalination phase, and to increase the solar illumination of the solar cell 110 in the flushing phase.

Some embodiments can be operated in a hybrid manner, wherein the system controller 170 can be configured to apply a voltage to the solar cell 110 and to synchronously control the illumination controller 172 to control a solar illumination of the solar cell. The polarity of the voltage plays a controlling role here: a forward bias voltage enhances the release of salt ions and thus is applied in the flushing phase, whereas a reverse bias voltage enhances the ion capture and thus is applied in the desalination phase. Such hybrid PVD systems 100 can be useful as they can be operated during the night, or when solar illumination is not available for some other reason.

Figure 5A:
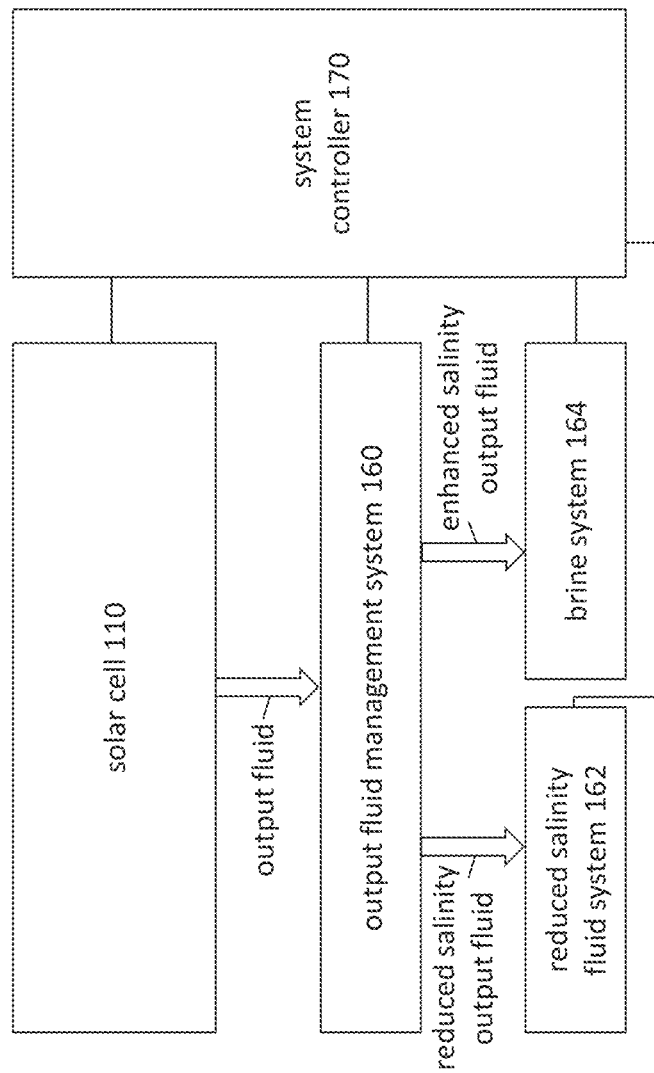

FIG. 5A illustrates an output portion of such ion-capture PVD systems 100 in further detail. In such PVD systems 100, the output fluid management system 160 can be switchably coupled to a reduced-salinity-fluid system 162 and to a brine system 164.

The system controller 170 can be configured to control the output fluid management system 160 to switchably guide the output fluid with a reduced salinity to the reduced-salinity-fluid system 162 during a portion of the desalination phase, and with an enhanced salinity to the brine system 164 during a portion of the flushing phase.

FIGS. 5B-E illustrate various embodiments of the output fluid management system 160. In most embodiments, the system controller 170 can control the operations of the output fluid management system 160. In some embodiments, the output fluid management system 160 can have its own, dedicated controller.

Figure 5B:
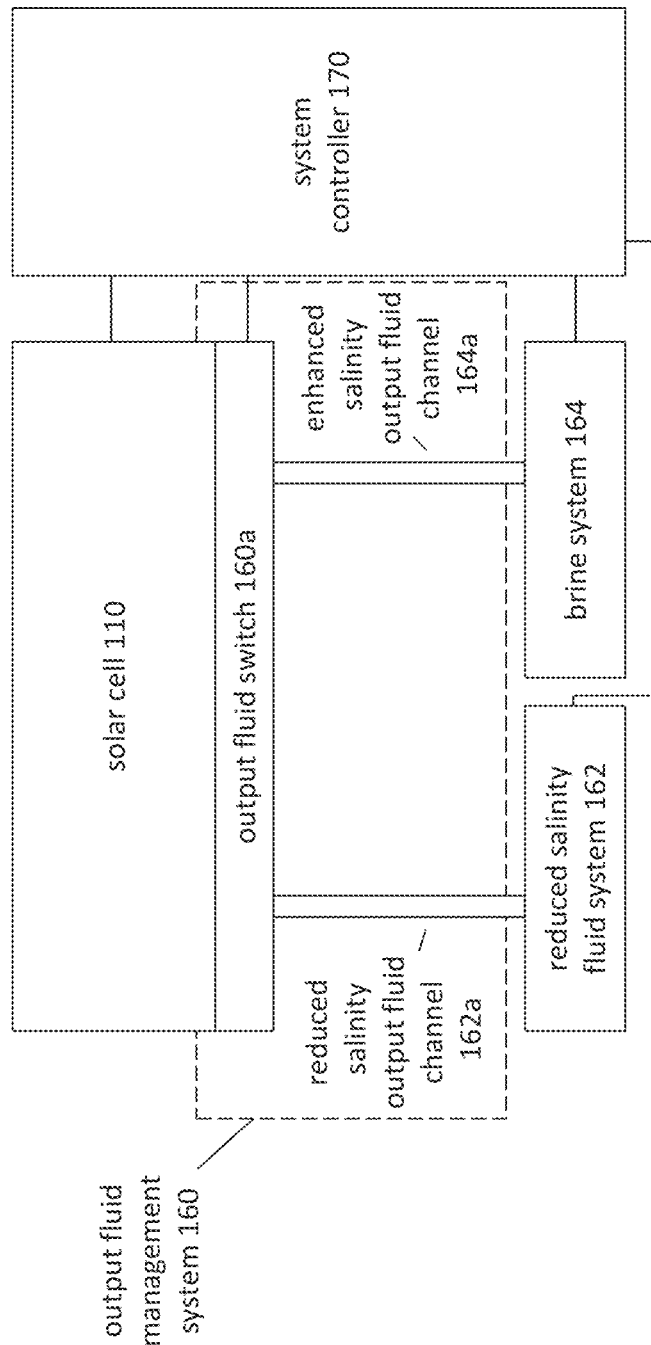

FIG. 5B illustrates that in some embodiments the output fluid management system 160 can include an output fluid switch 160a that performs the switching of the coupling of the output fluid between the reduced salinity system 162 and the brine system 164 during the cyclic operation. A large variety of fluid switches can be employed in this embodiment. The operation of the output fluid switch 160a can be synchronized with the cyclic operation of the illumination controller 172.

Figure 5C:
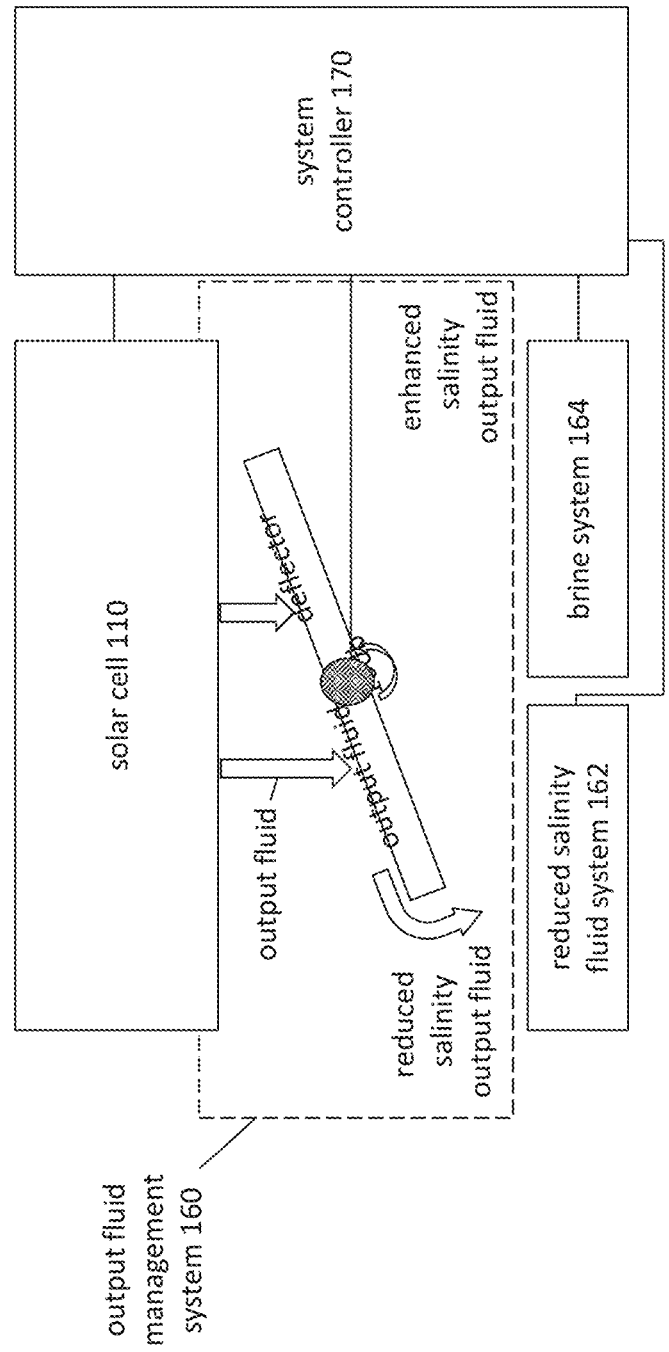

FIG. 5C illustrates that some embodiments of the output fluid management system 160 can include a rocking output fluid deflector 160b. In such embodiments, the output fluid can leave the channel array 140 under the influence of gravity, and the output fluid deflector 160b can switchably deflect the output fluid to the reduced salinity fluid system 162 and the brine system 164 by rocking back and forth in a seesaw manner. The rocking of the deflector 160b can be synchronized with the cyclic operation of the PVD system 100, including the illumination controller 172.

Figure 5D:
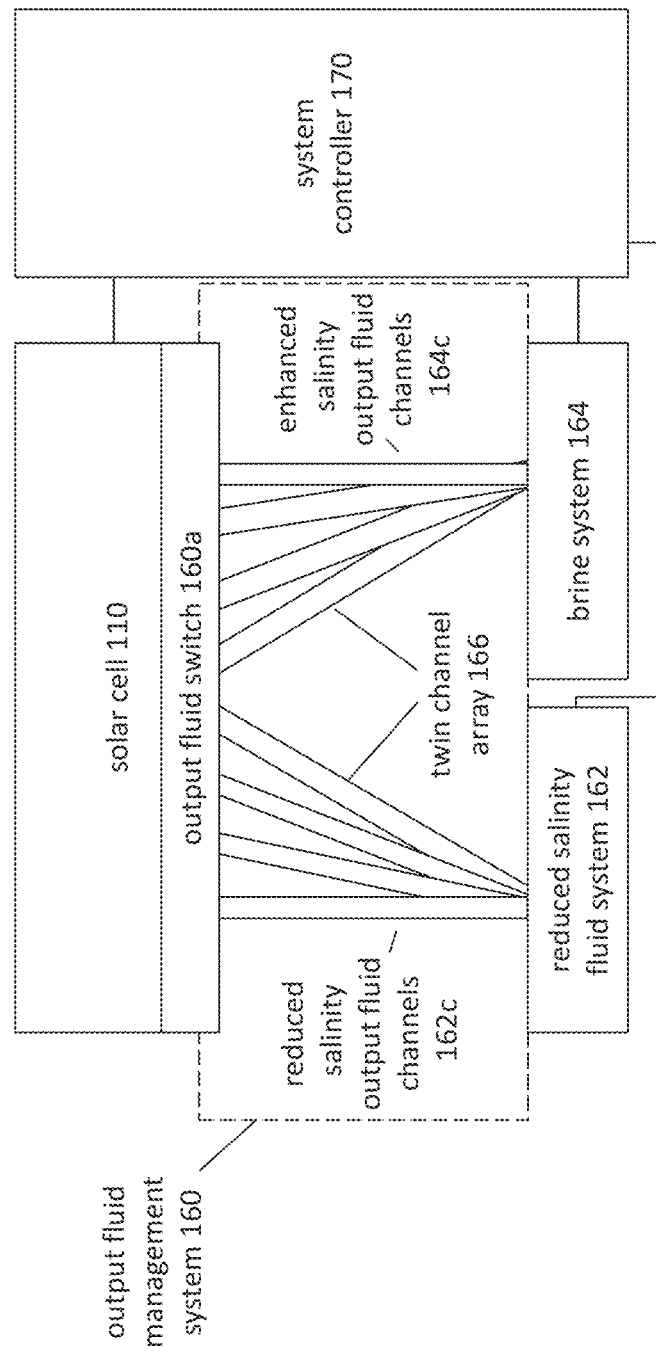

FIG. 5D illustrates that some embodiments of the output fluid management system 160 may include a twin channel array 166, working in conjunction with the output fluid switch 160a. In such embodiments there may be less "dead fluid" in the output fluid management system 160, i.e. less enhanced salinity fluid left in the system 160 at the start of the desalination phase, which would lead to a reduction of the overall system efficiency. The reduced salinity output fluid channels 162c of the twin channel array 166 can connect the output end of the channels 140i to the reduced salinity fluid system 162. The enhanced salinity output fluid channels 164c of the twin channel array 166 can connect the output end of the channels 140i to the brine system 164. The output fluid switch 160a can switch the coupling of the channels 140i to these two sets of twin channels 162c and 164c in an alternating manner.

FIG. 5E illustrates that in some embodiments the reduced-salinity-fluid system 162 can comprise a reduced-salinity-fluid container 162b, and the brine system 164 can comprise a brine container 164b, wherein the system controller 170 can be configured to move the two containers 162b and 164b to receive the output fluid in a cyclic manner. In some embodiments these two containers 162b and 164b can be rotated at a predetermined angular velocity, in sync with the cyclic operation of the system controller 170 and the illumination controller 172.

In some embodiments the system controller 170 can be configured to operate the photovoltaic desalination system 100 with the flushing phase lasting less than twice the desalination phase; in some embodiments with the flushing phase lasting less than the desalination phase. With such timing the duty cycle of the overall desalination operation can achieve favorable efficiencies.

Some embodiments can use a sequential operation to repeatedly reduce the salt content of the initially input salty fluid in order to reduce the salt content below a predetermined level such as below a water-purity standard. In such embodiments, the solar cell 110 can be coupled to a second solar cell. The solar cell 110 can couple its output fluid into the second solar cell to use it as its input salty fluid. In some PVD systems the solar cell and the second solar cell can be part of a stack of solar cells to desalinate the originally input salty fluid repeatedly 2, 3, or 4 times, or as many times as needed to reduce the salinity of the eventual output fluid below the targeted salinity level.

Some embodiments of the here-described PVD systems 100 may still need electrical power for their operations. For example, the pump 152 may require electric power for its operation. In some embodiments, a portion of the photovoltaic desalination system 100 can be powered by the solar cell 110 itself. In other embodiments, a portion of the PVD system 100 can be powered by an external power source.

Figure 6:
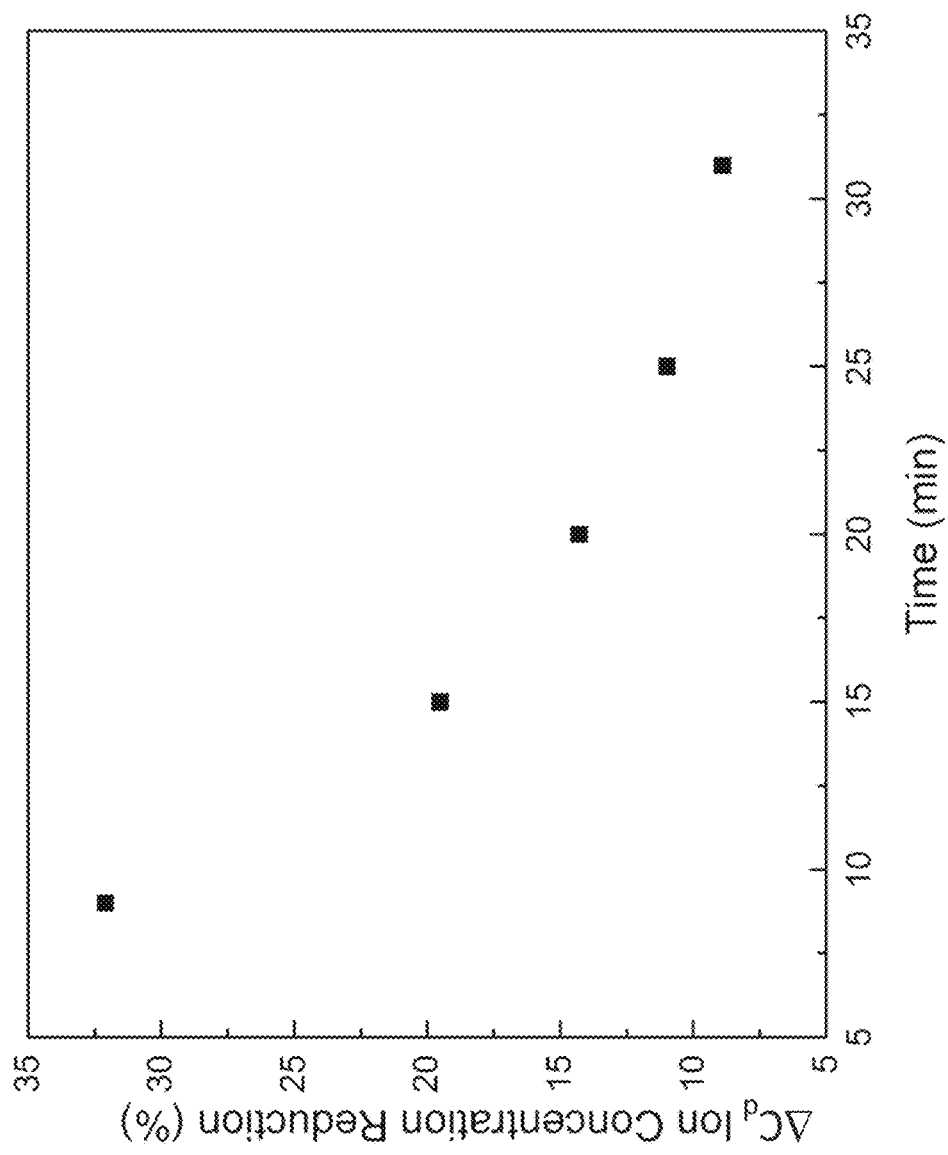
FIG. 6 illustrates an efficiency of a photovoltaic desalination system.

FIG. 6 illustrates the desalination efficiency of some embodiments of the PVD system 100. The ion concentration before and after the salty fluid passed through the PVD system 100 was determined by measuring the conductivity of the inputted salty liquid and the output liquid. As an informative example, a 100 mM NaCl solution was used as the inputted salty liquid. A calibration curve was determined to convert the measured conductivity values into ion concentration values. The embodiments were operated at ambient pressures, without any pump. As described in relation to FIG. 2A, solar illumination is decreasing the net charge densities of the space charge in the depletion region, and thus it decreases the built in field. Therefore, both the ion-rejection and the ion-capture desalination mechanisms become less effective under solar illumination. Accordingly, when the illumination controller 172 increased the illumination of the solar cell 110, the salt ions were released from the channels 140i and the PVD system 100 was flushed, outputting an enhanced-salinity brine. The shown data were measured for illumination power densities that were weaker than solar illumination power densities by a factor of 10 or more.

FIG. 6 illustrates $\Delta C_d$, the relative reduction of $C_d$, the ion concentration of the desalinated output fluid. $\Delta C_d$ was calculated by computing the difference between the desalinated concentration during the dark phase and the enhanced/flushed concentration during the illuminated phase, and expressing this difference relative to the enhanced concentration:

$$\Delta C_d = [C_d(\text{illuminated}) - C_d(\text{dark})] / C_d(\text{illuminated})$$

FIG. 6 demonstrates that the PVD systems 100 can be used quite efficiently for desalination: the desalination during the dark phase can remove as much as 30-35% of the salt ions by rejection or capture. Some embodiments were even indicative of a 50% salt ion concentration reduction. When adapting the shown measurements to illumination power densities and ion concentrations closer to values appropriate for seawater desalination, it is possible to conclude that similar, 30-50% concentration reductions can be achieved.

Using such embodiments, if the salty fluid is desalinated repeatedly, or sequentially, in a stack of N PVD systems 100, therefore, $0.5^N$-$0.7^N$ concentration reductions can be reached. For example, the ion concentration in seawater is around 500 mM, the accepted standard for freshwater is concentrations less than 10 mM. Thus, a concentration reduction to about 2% is required to desalinate seawater into fresh water. For the PVD systems with the above 30-50% concentration reduction, this means that a stack of 5-10 PVD systems can turn seawater into freshwater. Increasing the doping levels of the p-layer 120 and the n-layer 130, and using higher bandgap solar cells can further increase the desalination efficiency of the cells, reducing the number of cells required for a stack. Further, in a large market segment, the challenge is to desalinate brakish water that has a salinity that is only a fraction of the seawater. Such applications again require fewer solar cells in the stack.

FIG. 6 illustrates that the efficiency of the desalination visibly decreases with time, indicating that the ions captured or adsorbed on the channel walls start to saturate the wall surface. When the channel walls fill up with adsorbed ions, the illumination controller 172 can enable the illumination of the PVD system 100, thus flushing the adsorbed ions from the channels. The switching of the illumination controller 172 can be synchronized with the output fluid management system 160 to switch the coupling of the output liquid from the reduced salinity fluid system 162 to the brine system 164. Once the channel surfaces are largely regenerated, the desalination cycle can be started anew, the illumination controller 172 again blocking the solar illumination and the output fluid management system 160 again coupling the output fluid to the reduced salinity fluid system 162.

Figure 7:
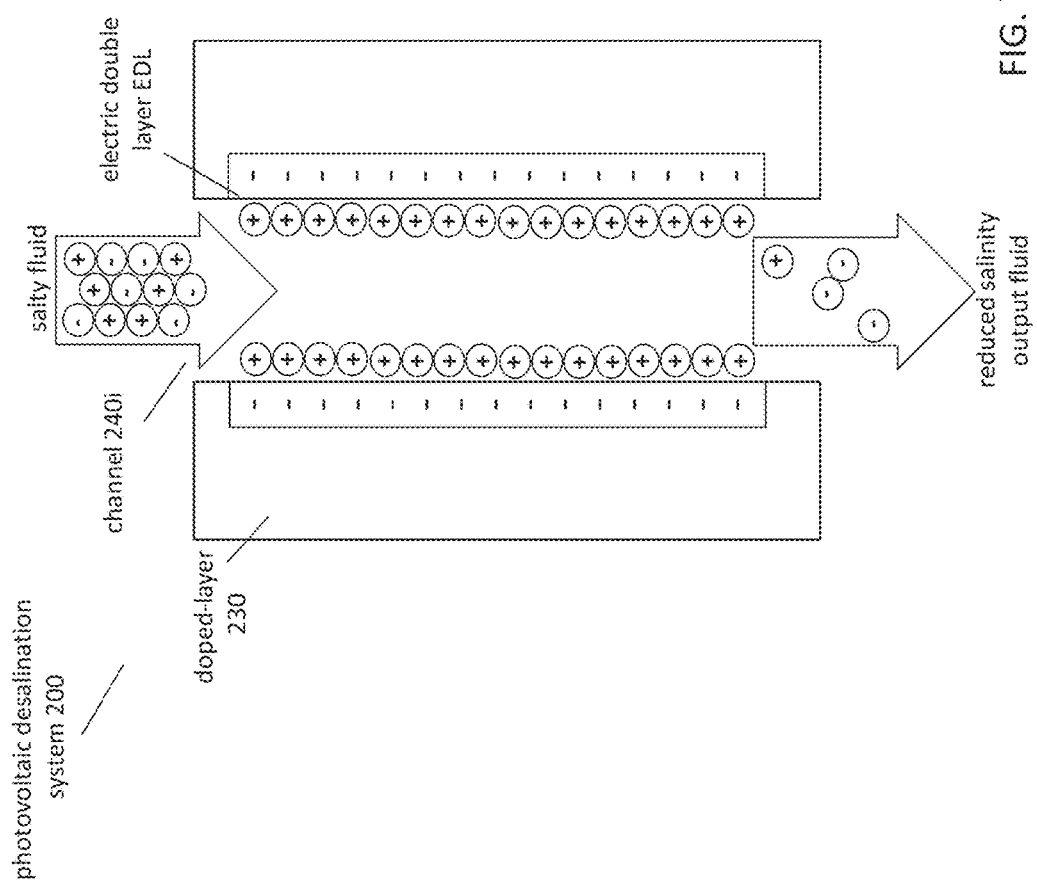
FIG. 7 illustrates an embodiment of a desalination system with a single semiconductor layer.

FIG. 7 illustrates an embodiment of a photovoltaic desalination system 200 that operates based on the secondary ion-capture mechanism, described earlier. Only a portion of the PVD system 200, an individual channel 240i is shown for clarity. The components not shown here expressly are analogous to the corresponding components of the PVD system 100, and are meant to be part of the PVD system 200 as well.

One of the differences between the PVD system 200 and the PVD system 100 is that the PVD system 200 can include only a single, doped semiconductor layer 230 instead of a p-layer and an n-layer that form a p-n junction. The ions of the salty fluid can still form an EDL at the wall of the channel 240i, leading to an adsorption and a capture of the ions from the fluid once more. The efficiency of this adsorption and capture can be considerably lower than that of the space-charge of the p-n junction-based PVD system 100. However, since the adsorption and capture is taking place along the entire 50-100 micron length of the wall, whereas the space-charge region of the PVD system 100 may be shorter than 1 micron, the low adsorption efficiency of the PVD system 200 may be compensated by the much longer adsorbing surface.

Applying a solar illumination can generate an enhanced number of electron-hole pairs that can at least partially neutralize the EDL at the wall of the channel. This again can facilitate the flushing of the channel 240i as needed for a cyclic operation. The rest of the description of the PVD system 200 can be analogous to the description of the PVD system 100.

Figure 8:
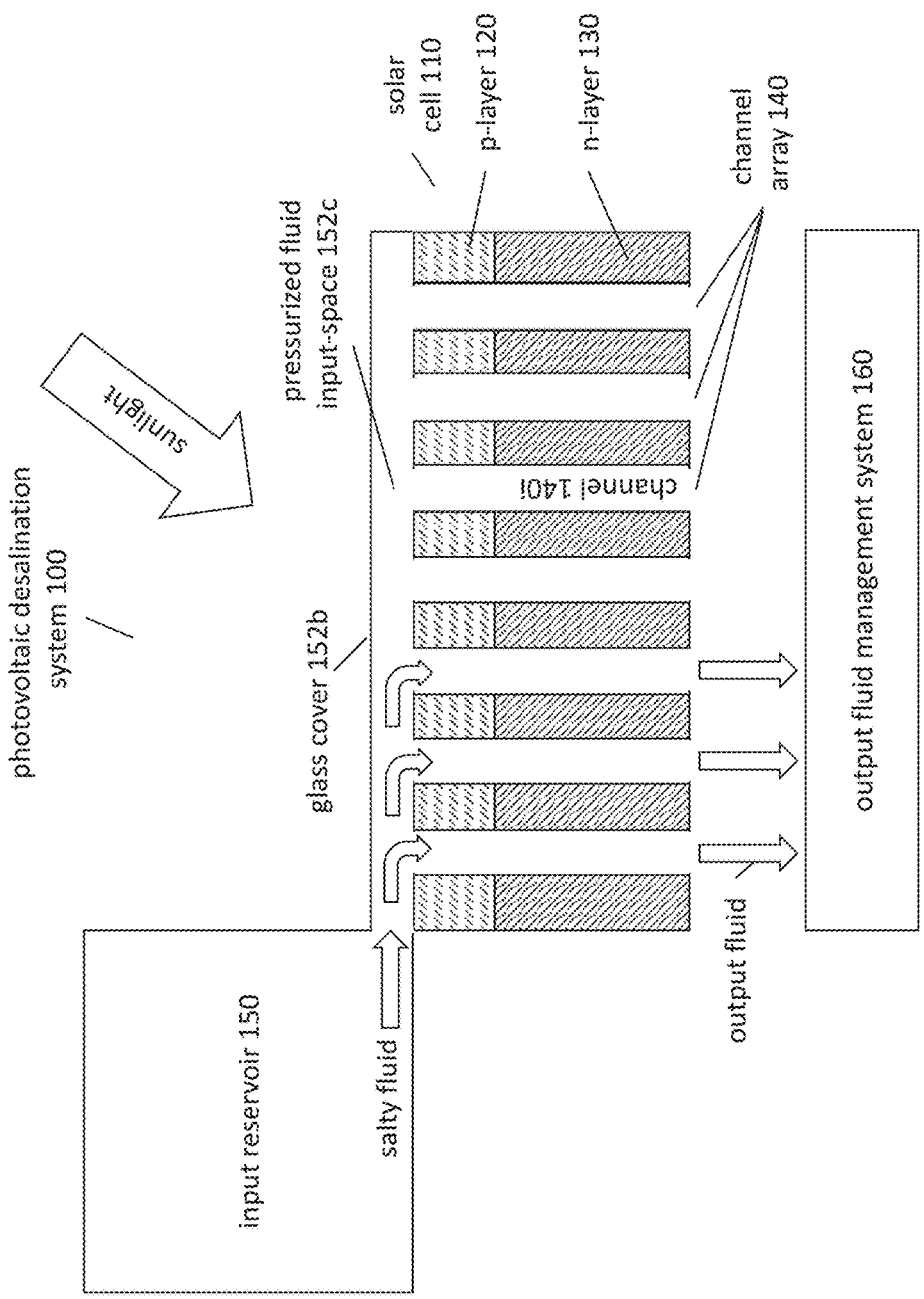
FIG. 8 illustrates embodiments of a photovoltaic desalination system with a pressurized fluid input system.

FIG. 8. illustrates an embodiment of the PVD system 100, where the pumping of the input salty fluid is enhanced using the photo-thermal effect of the sunlight, instead of using an electric-powered pump 152. In these embodiments, the frontal surface of the solar cell 110 can be covered with a glass cover 152b. The sunlight heats the salty liquid as it flows over the face of the solar cell 110, in a greenhouse-like heating action. The heated salty fluid can evaporate into a tight fluid input space 152c, thereby pressurizing it. This builds up a pressure on the salty fluid, forcing it through the channels 140i. While in most architectures this vapor pressure may not be sufficient to be the sole fluid-moving force, it can substantially reduce the electric power needed for operating the pump 152.

While this specification contains many specifics, these should not be construed as limitations on the scope of the invention or of what can be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features can be described above as acting in certain combinations and even initially claimed as such, one or more features from a claimed combination can in some cases be excised from the combination, and the claimed combination can be directed to a subcombination or variation of a subcombination.

The invention claimed is:
1. A photovoltaic desalination system, comprising:
  a solar cell, to receive solar radiation, including
    a p-doped semiconductor layer,
    an n-doped semiconductor layer, the two semiconductor layers forming a p-n junction, and
    a channel array comprising channels for fluid to pass through, formed in the p-n junction;
  an input reservoir, coupled to the solar cell, wherein the input reservoir
    contains a salty fluid, and
    releases the salty fluid to the solar cell; and
  an output fluid management system, coupled to the solar cell, the output fluid management system to receive an output fluid from the solar cell; wherein
  the channel array
    receives the salty fluid from the input reservoir, and
    outputs the output fluid to the output fluid management system.

2. The photovoltaic desalination system of claim comprising:
a pump, to pump the salty fluid from the input reservoir to the channel array.

3. The photovoltaic desalination system of claim 1, wherein:
the channels of array are formed perpendicular to the two semiconductor layers through the p-n junction.

4. The photovoltaic desalination system of claim 1, wherein:
the channels of the array are formed parallel two semiconductor layers in the p-n junction.

5. The photovoltaic desalination system of claim 1, wherein:
a separation of the channels of the array is less than 1,000 nm.

6. The photovoltaic desalination system of claim 5, wherein:
a separation of the channels of array is less than 200 nm.

7. The photovoltaic desalination system of claim 1, wherein:
an are density of channels is greater than $10^6$ channels/m$^2$.

8. The photovoltaic desalination system of claim 7, wherein:
an are density of channels is greater than $10^7$ channels/m$^2$.

9. The photovoltaic desalination system of claim 1, wherein:
an area fraction of the channels is in the range of 10-50%.

10. The photovoltaic desalination system of claim 1, wherein:
an area fraction of the channels is in the range of 50-90%.

11. The photovoltaic desalination system of claim 1, wherein:
a radius of the channels is less than 1.00 nm.

12. The photovoltaic desalination system of claim 11, wherein:
a radius of the channels is less than 20 nm.

13. The photovoltaic desalination system of claim 1, comprising:
a system controller, to operate the photovoltaic desalination system in a cyclic manner, including
a desalination phase; and
a flushing phase.

14. The photovoltaic desalination system of claim 13, wherein:
the photovoltaic desalination system outputs the output fluid, wherein the output fluid
has a reduced salinity in the desalination phase, and
has an enhanced salinity in the flushing phase.

15. The photovoltaic desalination system of claim 13, comprising:
an illumination co Her, to adjust a solar illumination of the solar cell; wherein
the system controller controls the illumination controller
to decrease a solar illumination of the solar cell in the desalination phase, and
to increase the solar illumination of the solar cell in the flushing phase.

16. The photovoltaic desalination system of claim 13, wherein:
the system controller
applies a voltage to the solar cell, and
synchronously controls an illumination controller to control the solar illumination of the solar cell.

17. The photovoltaic desalination system of claim 13, wherein the output fluid management system is switchably coupled to
a reduced-salinity-fluid system, and
a brine system; wherein
the system controller controls the output fluid management system to switchably guide the output fluid
to the reduced-salinity-fluid system during a portion of the desalination phase, and
to the brine system during a portion of the flushing phase.

18. The photovoltaic desalination system of claim 17, wherein the output fluid management system comprises:
at least one of an output fluid switch, an output fluid deflector, and a twin channel array.

19. The photovoltaic desalination system of claim 17, wherein:
the reduced-salinity-fluid system comprises a reduced-salinity container, and
the brine system comprises a brine container, wherein the system controller moves the two containers to receive the output fluid in a cyclic manner.

20. The photovoltaic desalination system of claim 13, wherein:
the system controller operates the photovoltaic desalination system with the flushing phase lasting less than twice the desalination phase.

21. The photovoltaic desalination system of claim 13, wherein:
the system controller operates the photovoltaic desalination system with the flushing phase lasting less than the desalination phase.

22. The photovoltaic desalination system of claim 1, wherein:
the solar cell is coupled to a second solar cell, and
the second solar cell receives a salty fluid from the input reservoir after the salty fluid has been outputted as the output fluid of the solar cell.

23. The photovoltaic desalination system of claim 22, wherein:
the solar cell and the second solar cell are part of a stack of solar cells.

24. The photovoltaic desalination system of claim 1, wherein:
a portion of the system is powered by the solar cell.

25. The photovoltaic desalination system of claim 1, wherein:
a portion of the system is powered by an external power source.

26. The photovoltaic desalination system of claim 1, comprising:
a transparent cover over a frontal portion of the solar cell, to form a pressurized fluid input space.

27. A photovoltaic desalination system, comprising:
a doped semiconductor layer, to receive solar illumination;
a channel array, comprising channels for fluid to pass through formed in the doped semiconductor layer;
an input reservoir, coupled to the semiconductor layer, wherein the input reservoir
contains a salty fluid, and
releases the salty fluid to the doped semiconductor layer; and
an output fluid management system, coupled to the doped semiconductor layer, the output fluid management system to receive an output fluid from the doped semiconductor layer; wherein
the channel array
receives the salty fluid from the input reservoir, and outputs the output fluid to the output fluid management system.

* * * * *

UNITED STATES PATENT AND TRADEMARK OFFICE
CERTIFICATE OF CORRECTION

Page 1 of 1

PATENT NO. : 10,361,329 B2
APPLICATION NO. : 15/136475
DATED : July 23, 2019
INVENTOR(S) : Yemaya Bordain et al.

It is certified that error appears in the above-identified patent and that said Letters Patent is hereby corrected as shown below:

On the Title Page

Item (73), In Assignee, please add -- Lawrence Livermore National Security, LLC, Livermore, CA (US) --

Signed and Sealed this
Twenty-fourth Day of March, 2020

Andrei Iancu
*Director of the United States Patent and Trademark Office*